US 6,870,271 B2

(12) United States Patent
Sutherland et al.

(10) Patent No.: US 6,870,271 B2
(45) Date of Patent: Mar. 22, 2005

(54) INTEGRATED CIRCUIT ASSEMBLY MODULE THAT SUPPORTS CAPACITIVE COMMUNICATION BETWEEN SEMICONDUCTOR DIES

(75) Inventors: Ivan E. Sutherland, Santa Monica, CA (US); Robert J. Drost, Mountain View, CA (US); Gary R. Lauterbach, Los Altos Hills, CA (US); Howard L. Davidson, San Carlos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/671,642

(22) Filed: Sep. 26, 2003

(65) Prior Publication Data

US 2004/0145063 A1 Jul. 29, 2004

Related U.S. Application Data

(60) Provisional application No. 60/443,808, filed on Jan. 29, 2003.

(51) Int. Cl.[7] .............................. H01L 23/52; H05K 7/00
(52) U.S. Cl. ........................ 257/777; 257/691; 257/723; 361/735
(58) Field of Search ................................ 257/777, 691, 257/723; 361/735, 676, 688

(56) References Cited

U.S. PATENT DOCUMENTS 5,491,612 A * 2/1996 Nicewarner, Jr. ........... 361/760
5,703,400 A * 12/1997 Wojnarowski et al. ...... 257/723
6,500,696 B2   12/2002 Sutherland .................. 438/109
6,507,115 B1 *  1/2003 Hofstee et al. ............. 257/777
6,552,423 B2 *  4/2003 Song et al. ................. 257/679
6,555,917 B1 *  4/2003 Heo ........................... 257/777
6,555,918 B2 *  4/2003 Masuda et al. ............. 257/777
6,586,836 B1 *  7/2003 Ma et al. .................... 257/723

* cited by examiner

Primary Examiner—Jasmine Clark
(74) Attorney, Agent, or Firm—Park, Vaughan & Fleming LLP

(57) ABSTRACT

One embodiment of the present invention provides an integrated circuit assembly module, including a first semiconductor die and a second semiconductor die, each semiconductor die with an active face upon which active circuitry and signal pads reside and a back face opposite the active face. The first and second semiconductor dies are positioned face-to-face within the assembly module so that signal pads on the first semiconductor die overlap with signal pads on the second semiconductor die, thereby facilitating capacitive communication between the first and second semiconductor dies. Additionally, the first and second semiconductor dies are pressed together between a first substrate and a second substrate so that a front side of the first substrate is in contact with the back face of the first semiconductor die and a front side of the second substrate is in contact with the back face of the second semiconductor die.

24 Claims, 2 Drawing Sheets

HERRINGBONE 302

CHECKERBOARD 304

MOSAIC 306

TIGHT CHECKERBOARD 308

CHIPS FACING UP

CHIPS FACING DOWN

AREA OF OVERLAP

INTEGRATED CIRCUIT ASSEMBLY
MODULE THAT SUPPORTS CAPACITIVE
COMMUNICATION BETWEEN
SEMICONDUCTOR DIES

RELATED APPLICATION

This application hereby claims priority under 35 U.S.C. 119 to U.S. Provisional Patent Application No. 60/443,808, filed on 29 Jan. 2003, entitled "Silicon Module for Face to Face Chips," by inventor Robert J. Drost.

GOVERNMENT LICENSE RIGHTS

This invention was made with United States Government support under Contract No. NBCH020055 awarded by the Defense Advanced Projects Administration. The United States Government has certain rights in the invention.

BACKGROUND

1. Field of the Invention

The present invention relates to semiconductor integrated circuits. More specifically, the present invention relates to an integrated circuit assembly module that supports capacitive communication between semiconductor dies.

2. Related Art

Integrated circuit chips ordinarily communicate with one another through external wiring on a printed circuit board. In order to adapt the tiny dimensions of the integrated circuit to the larger dimensions of the wires on the printed circuit board, the integrated circuit is typically mounted in a "package" made of plastic or ceramic.

Integral to the package are a set of metal conductors, one for each connection to the integrated circuit. These metal conductors are typically connected to the integrated circuit via gold or aluminum "bonding wires." These bonding wires are typically 25 microns in diameter, and are attached to "bonding pads" on the integrated circuit that typically measure 100 microns square. The other end of the bonding wires are attached to metal conductors that range from 200 to 500 microns in size, with the larger ends attached to a printed circuit board. In order for signals to travel from one integrated circuit to another, they must past through several sets of drivers to drive the signal over increasingly larger areas.

As the trend towards smaller and smaller integrated circuits with increasing numbers of transistors continues, limited communications paths on to and off of the chip are quickly becoming a major bottleneck to processor performance. Because advances in packaging technologies have not kept pace with increasing semiconductor integration densities, inter-chip communication bandwidth has not kept pace with on-chip computational power. Moreover, as feature sizes continue to decrease, the delay for communications off of the chip has increased, because more time is required to amplify small on-chip signal lines to drive large bonding pads.

Hence, what is needed is a method and an apparatus for communicating between semiconductor chips in a manner that reduces the amount of space and power required for the communication process.

SUMMARY

One embodiment of the present invention provides an integrated circuit assembly module, including a first semiconductor die with an active face upon which active circuitry and signal pads reside and a back face opposite the active face, and a second semiconductor die with an active face upon which active circuitry and signal pads reside and a back face opposite the active face. The first semiconductor die and the second semiconductor die are positioned face-to-face within the assembly module so that signal pads on the first semiconductor die overlap with signal pads on the second semiconductor die, thereby facilitating capacitive communication between the first semiconductor die and the second semiconductor die. Additionally, the first semiconductor die and the second semiconductor die are pressed together between a first substrate and a second substrate so that a front side of the first substrate is in contact with the back face of the first semiconductor die and a front side of the second substrate is in contact with the back face of the second semiconductor die.

In a variation on this embodiment, the integrated circuit assembly module further includes a first heat removal mechanism coupled to the back side of the first substrate opposite the front side, and a second heat removal mechanism coupled to the back side of the second substrate opposite the front side.

In a further variation, the first and second heat removal mechanisms include cooling fins to facilitate the transfer of heat to air passing across the cooling fins.

In a further variation, the first and second heat removal mechanisms include graphite foam or metal with fin-like structures which facilitate in the transfer of heat to a liquid pumped through the graphite foam or metal.

In a variation on this embodiment the integrated circuit assembly module further includes a first power supply coupled to the back side of the first substrate, and a second power supply coupled to the back side of the second substrate.

In a further variation, the first and second substrates include metal layers that facilitate supplying power to the first and second semiconductor dies.

In a further variation, the first and second substrates include power connectors on the back sides of the first and second substrates.

In a further variation, the integrated circuit assembly module further comprises Micro Electro-Mechanical System (MEMS) spring contacts that provide power from the metal layers within the first and second substrates to the first and second semiconductor dies. In this embodiment, a first set of MEMS spring contacts on the front side of the first substrate contact the active side of the second semiconductor die, and a second set of MEMS spring contacts on the front side of the second substrate contact the active side of the first semiconductor die.

In a further variation, a first power regulator is incorporated within the first substrate, and a second power regulator is incorporated within the second substrate.

In a further variation, the integrated circuit assembly module further includes an I/O semiconductor die with an active face upon which active circuitry and signal pads reside, and a back face opposite the active face. This I/O semiconductor die and the second semiconductor die are arranged face-to-face such that signal pads on the I/O semiconductor die overlap with signal pads on the second semiconductor die, thereby facilitating capacitive communication between the I/O semiconductor die and the second semiconductor die. Additionally, the I/O semiconductor die is located on an edge of the first substrate to facilitate communications into and out of the integrated circuit assembly module. The edge of the first substrate extends beyond the edge of the second substrate so that a portion of the active face of the I/O semiconductor die is exposed to facilitate external connections.

In a further variation, the integrated circuit assembly module further includes optical connection pads located on the exposed portion of the active side of the I/O semiconductor die.

In a further variation, the integrated circuit assembly module further includes electrical connection pads located on the exposed portion of the active side of the I/O semiconductor die.

DETAILED DESCRIPTION

Figure 1:
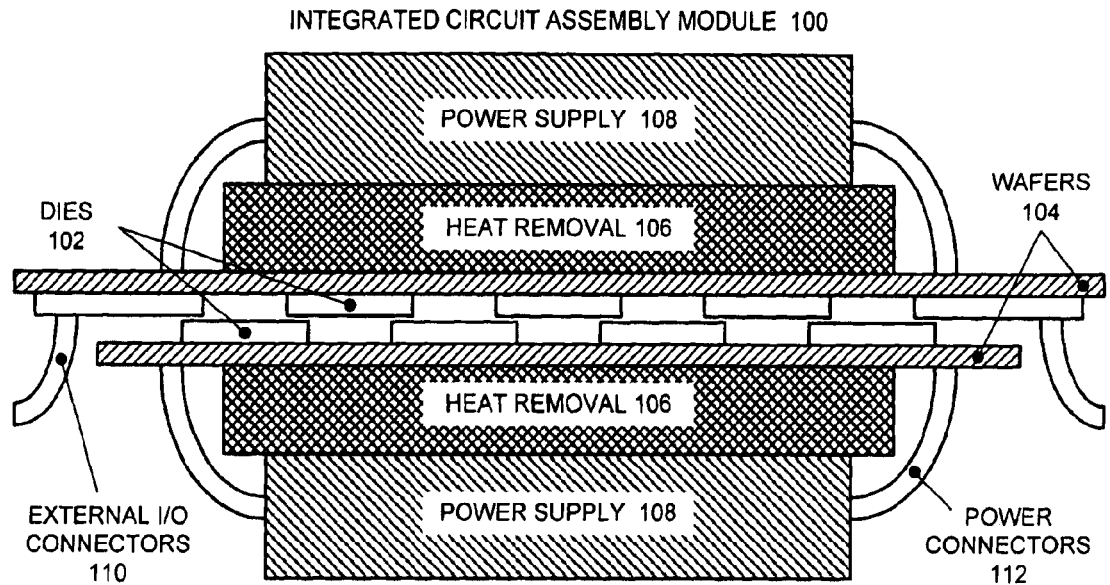
FIG. 1 illustrates an integrated circuit assembly module in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

BACKGROUND

In one embodiment of the present invention, an integrated circuit assembly module includes an almost symmetric stacking of components. An arbitrary number of chips are tiled between two substrates (wafers). This tiling arrangement does not need to be uniform. Hence, the integrated circuit assembly module could contain chips of different sizes and could contain empty positions.

The wafers contain alignment structures that precisely position chips that are placed between them. Two layers of chips are used in this system, one layer for each of the two wafers. Each layer of chips sits with the back-side of the chips against the wafer, and the front side (the side that contains the active circuitry and wires) facing the chips on the other wafer.

Each wafer may contain alignment structures for one layer of chips. Alternately, one wafer may contain the alignment structures for both layers of chips. If both wafers contain alignment structures, which may be simpler to fabricate, then it is required that the wafers be aligned to each other in order to align the relative positions of the chips between the two layers. If one wafer contains the alignment structures for both chips, then chips may be more accurately aligned.

The alignment structures may include posts built up on the flat wafer surfaces. The chips may be aligned by providing a cavity using a partial or full perimeter of posts. Alternately, the chips may be aligned by posts that fit through holes in the chips. Two holes per chip would be required, and more may be used to add redundancy. Aligning using a cavity requires less chip complexity, but it also requires that the chips be trimmed to a precise size to fit the cavities. Aligning using posts and holes may provide greater accuracy because the holes on the chip could be created by etching the holes and using an annulus formed by the existent metal interconnect layers to guide the etching process.

The chips do not need to be permanently attached to the wafers. This makes it possible to remove a chip from a fully assembled integrated circuit assembly module if it is determined that the chip is defective. Additionally, chips may be upgraded to higher speeds, or replaced by chips with different functionality.

The chips may be attached to the wafer by a mild adhesive to make it easier to handle and assemble the module. The adhesive could be as simple as water vapor, in which case no additional adhesive would be needed in an atmosphere that contains sufficient humidity. If more adhesion is required, then the surface could be coated with a suitable material. The adhesive may additionally have beneficial heat transfer properties, improving the thermal coupling between chip and wafer. A chip may be permanently attached to the wafers if there is no advantage to removing it in a particular application.

The wafers are pressed firmly together for operational use of the integrated circuit assembly module. Pressing the wafers together brings the active side of the face-to-face chips close enough to allow for capacitive communication between the chips. The alignment structures for the chips are created with sufficient clearance to allow the chip surfaces to abut when the wafers are pressed together.

The wafers are polished to be flat. The chips may have non-uniform heights. For instance the center portion of the chips may have additional layers laminated to them, increasing the chip thickness. However, the chip surfaces are flat where the chips on the two layers contact each other. Thus, this contact surface is planar across the wafers.

The wafers may have an elastic layer, such as a polymer, that contacts the chip's back surface. If two chips have different heights, when an integrated circuit assembly module is assembled, the form of the touching chips would deform the elastic layer and help to make planar the top surface of the chips. If the elastic layer has adhesive properties and beneficial properties, then the layer could also act to attach the chips and facilitate improved heat transfer.

The silicon wafers have conductive interconnect layers in them to carry power, ground, and other signals. These layers are fabricated into the wafers before the wafers are polished smooth and the alignment structures are added. These conductive layers connect using spring MEMS structures that are patterned onto the wafers. When the wafers are pressed together, the spring heights and positions are such that the springs connect power, ground, and other signals to the chips. The active facing layer of chips contact the spring structures on the opposing wafer. The wafers may contain active circuitry to aid in regulating the voltage supply delivered to the chips. The conductive layers may contain voltage sensing traces that feedback to the power supplies the voltage delivered to the chip after I×R (current times resistance) loss. The power supplies can regulate their output voltage to correct for the I×R loss.

Integrated Circuit Assembly Module

FIG. 1 illustrates an integrated circuit assembly module 100 in accordance with an embodiment of the present invention. Integrated circuit assembly module 100 includes dies 102 (also referred to as "chips"). Dies 102 are semiconductor dies that may include any type of computational circuitry, including main memory, cache memory, and processors. Dies 102 are arranged active face to active face and overlapped to facilitate capacitive communication between dies.

Dies 102 are pressed together by wafers 104. Wafers 104 contain alignment structures that precisely position dies 102 to facilitate proximity communication. Note that wafers 104 can be silicon substrates that are comprised of the same material as dies 102. (They can alternatively be comprised of other materials that are not silicon.) One of the two wafers in wafers 104 extends than the other in one dimension to allow for perimeter chips at the edges of integrated circuit assembly module 100 to extend beyond the opposite wafer. The exposed portions of the perimeter chips allow for external I/O connections via external I/O connectors 110. These external I/O connectors 110 can be either electrical, optical, and any other type of connectors that can be used the transfer data.

On the opposite sides of wafers 104 from dies 102 are heat removal devices 106, which may include any standard heat removal devices such as heat sinks with fans. In one embodiment of the present invention, heat removal devices 106 can be made of a graphite foam (or other material, such as a metal) with fin-like structures that transfer heat to a liquid that is pumped through the graphite foam.

Coupled to the opposite side of heat removal devices 106 from wafers 104 are power supplies 108. Power supplies 108 are standard integrated circuit power supplies, and are attached to wafers 104 via power connectors 112. Note that FIG. 1 is drawn for illustration purposes only and is not drawn to scale.

Integrated Circuit Assembly Module with Power Connections

Figure 2:
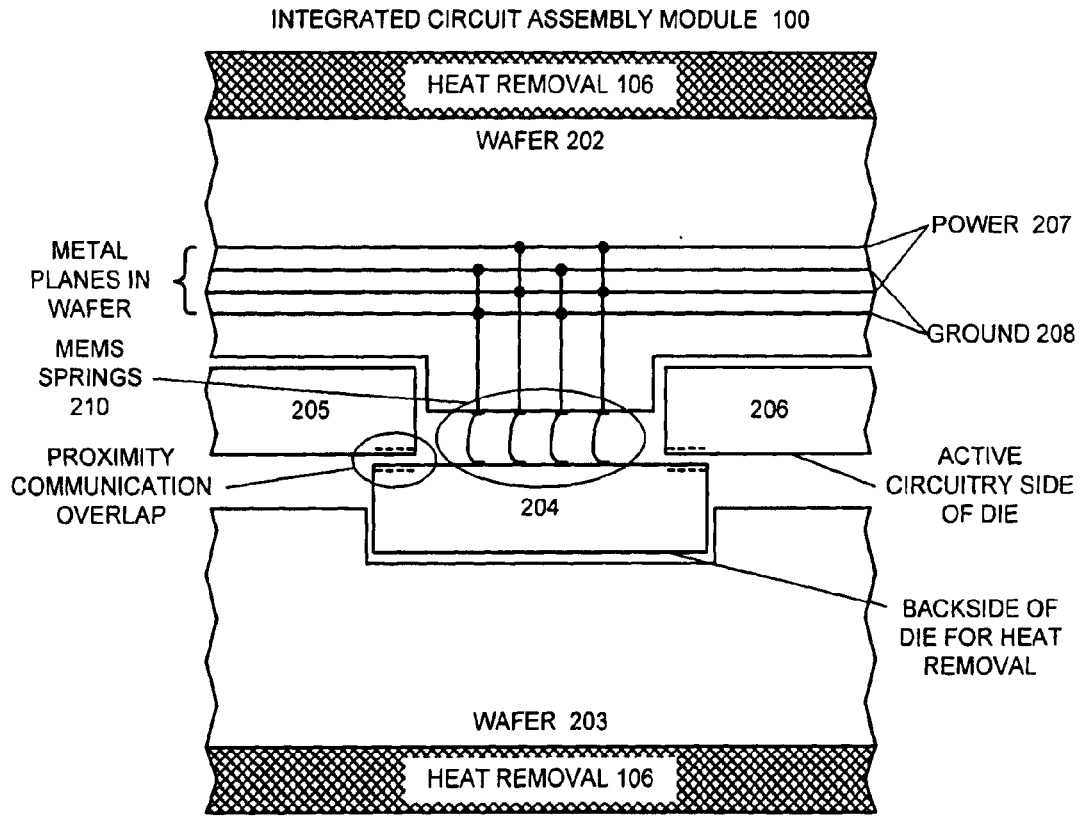
FIG. 2 illustrates a portion of an integrated circuit assembly module with power connections in accordance with an embodiment of the present invention.

FIG. 2 illustrates a portion of an integrated circuit assembly module 100 with power connections in accordance with an embodiment of the present invention. Integrated circuit assembly module 100 contains metal planes that provide power 207 and ground 208 to dies 102 within integrated circuit assembly module 100, such as dies 204, 205, and 206. Since dies 204 to 206 are arranged with their active circuitry side facing each other, it is beneficial to connect power 207 and ground 208 to each chip from the wafer on the opposite side. For example, power 207 and ground 208 in wafer 202 can be attached to chip 204 via MEMS spring contacts 210. Similarly, power and ground for dies 205 and 206 can be provided through MEMS spring contacts from wafer 203.

In one embodiment of the present invention, integrated circuit assembly module 100 is a complete self-contained system containing both memory and processor chips. In this embodiment, external I/O connectors 110 can connect integrated circuit assembly module 100 to other computers or to other integrated circuit assembly modules. Note that FIG. 2 is not drawn to scale.

Proximity Communication Overlap Patterns

Figure 3:
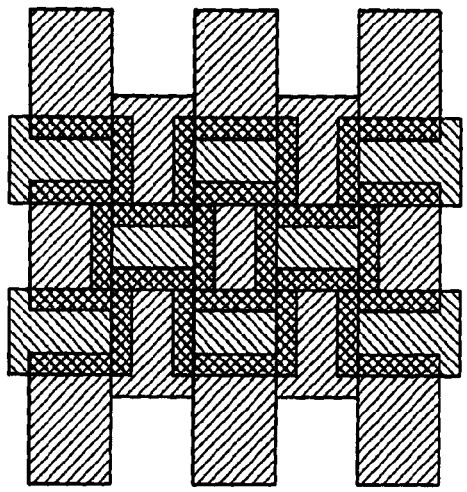
FIG. 3 presents proximity communication overlap patterns in accordance with an embodiment of the present invention.
Figure 3:
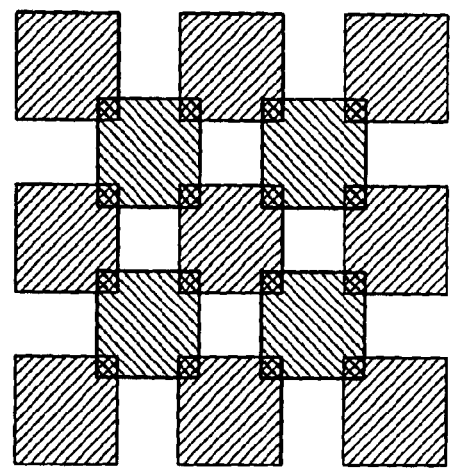
Figure 3:
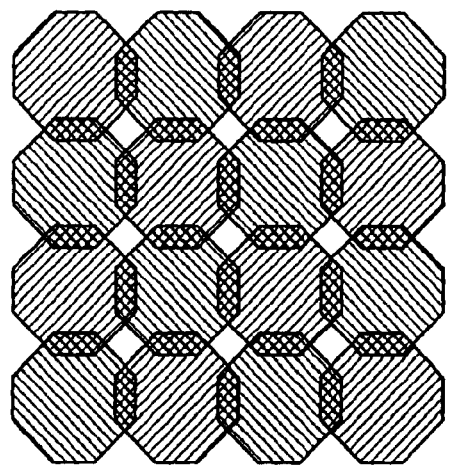
Figure 3:
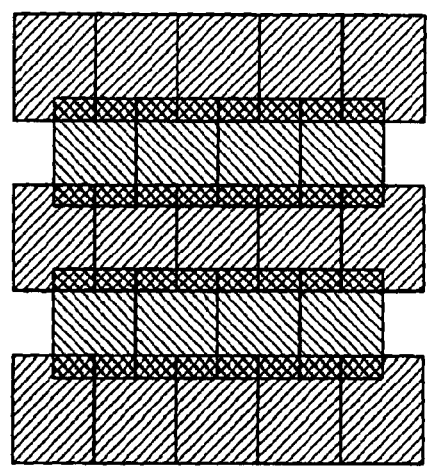
Figure 3:
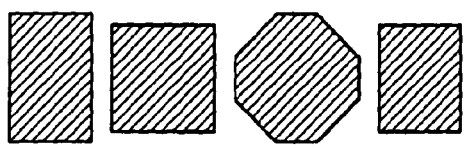
Figure 3:
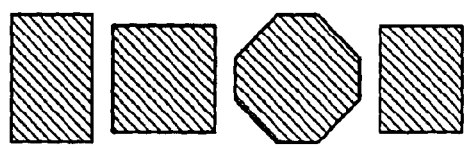
Figure 3:

FIG. 3 presents various arrangements of chips to facilitate proximity communication between chips. Each patterns offers a different amount of overlap between chips. In some instances it might be better to maximize the overlap between chips, such as in herringbone 302 and mosaic 306, while in other instances it might be better to maximize space between chips to facilitate heat removal, such as in checkerboard 304 and tight checkerboard 308. Various tradeoffs exist with each pattern as well. More overlapping connections between chips might result in better bandwidth between chips, but conversely, more of the chip is being used for chip-to-chip communication and less of the chip is being used for other functions of the chip. Specific chip arrangements might prove to be optimal for specific types of chips as well. For instance, an integrated circuit module that contains only memory chips might utilize herringbone 302 as an optimal pattern, while an integrated circuit module that contains memory and processor chips might utilize checkerboard 304 as an optimal pattern.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated circuit assembly module, comprising:
   a first substrate, with a front face and a back face opposite the front face;
   a first semiconductor die with an active face upon which active circuitry and signal pads reside, and a back face opposite the active face;
   a second semiconductor die with an active face upon which active circuitry and signal pads reside, and a back face opposite the active face;
   a second substrate, with a front face and a back face opposite the front face;
   wherein the first semiconductor die and the second semiconductor die are arranged active face to active face so that signal pads on the first semiconductor die overlap with signal pads on the second semiconductor die, thereby facilitating capacitive communication between the first semiconductor die and the second semiconductor die; and
   wherein the first semiconductor die and the second semiconductor die are pressed together between the first substrate and the second substrate so that the front face of the first substrate is in contact with the back face of the first semiconductor die and the front face of the second substrate is in contact with the back face of the second semiconductor die.

2. The integrated circuit assembly module of claim 1, further comprising:
   a first heat removal mechanism coupled to the back face of the first substrate; and
   a second heat removal mechanism coupled to the back face of the second substrate.

3. The integrated circuit assembly module of claim 2, wherein the first and second heat removal mechanisms include cooling fins to facilitate the transfer of heat to air passing across the cooling fins.

4. The integrated circuit assembly module of claim 2, wherein the first and second heat removal mechanisms include graphite foam or metal with fin-like structures which facilitate in the transfer of heat to a liquid pumped through the graphite foam or metal.

5. The integrated circuit assembly module of claim 1, further comprising:
   a first power supply coupled to the back face of the first substrate; and
   a second power supply coupled to the back face of the second substrate.

6. The integrated circuit assembly module of claim 1, wherein the first and second substrates include metal layers that supply power to the first and second semiconductor dies.

7. The integrated circuit assembly module of claim 6, wherein the first and second substrates include power connectors on the back faces of the first and second substrates.

8. The integrated circuit assembly module of claim 6, further comprising Micro Electro-Mechanical System (MEMS) spring contacts that provide power from the metal layers within the first and second substrates to the first and second semiconductor dies, wherein:

a first set of MEMS spring contacts on the front face of the first substrate contact the active side of the second semiconductor die; and a second set of MEMS spring contacts on the front face of the second substrate contact the active side of the first semiconductor die.

9. The integrated circuit assembly module of claim 6, further comprising:

a first power regulator incorporated within the first substrate; and a second power regulator incorporated within the second substrate.

10. The integrated circuit assembly module of claim 1, further comprising:

an I/O semiconductor die with an active face upon which active circuitry and signal pads reside, and a back face opposite the active face;

wherein the I/O semiconductor die and the second semiconductor die are arranged active face to active face, so that signal pads on the I/O semiconductor die overlap with signal pads on the second semiconductor die, thereby facilitating capacitive communication between the I/O semiconductor die and the second semiconductor die;

wherein the I/O semiconductor die is located on an edge of the first substrate to facilitate in providing communications into and out of the integrated circuit assembly module; and wherein the edge of the first substrate extends beyond the edge of the second substrate so that a portion of the active face of the I/O semiconductor die is exposed to facilitate external connections.

11. The integrated circuit assembly module of claim 10, further comprising optical external connection pads located on the exposed portion of the active side of the I/O semiconductor die.

12. The integrated circuit assembly module of claim 10, further comprising electrical external connection pads located on the exposed portion of the active side of the I/O semiconductor die.

13. A computer system comprising an integrated circuit assembly module, comprising:

a first substrate, with a front face and a back face opposite the front face;

a first semiconductor die with an active face upon which active circuitry and signal pads reside, and a back face opposite the active face;

a second semiconductor die with an active face upon which active circuitry and signal pads reside, and a back face opposite the active face;

a second substrate, with a front face and a back face opposite the front face;

wherein the first semiconductor die and the second semiconductor die are arranged active face to active face so that signal pads on the first semiconductor die overlap with signal pads on the second semiconductor die, thereby facilitating capacitive communication between the first semiconductor die and the second semiconductor die; and wherein the first semiconductor die and the second semiconductor die are pressed together between the first substrate and the second substrate so that the front face of the first substrate is in contact with the back face of the first semiconductor die and the front face of the second substrate is in contact with the back face of the second semiconductor die.

14. The computer system of claim 13, wherein the integrated circuit assembly module further comprises:

a first heat removal mechanism coupled to the back face of the first substrate; and a second heat removal mechanism coupled to the back face of the second substrate.

15. The computer system of claim 14, wherein the first and second heat removal mechanisms include cooling fins to facilitate the transfer of heat to air passing across the cooling fins.

16. The computer system of claim 14, wherein the first and second heat removal mechanisms include graphite foam or metal with fin-like structures which facilitate in the transfer of heat to a liquid pumped through the graphite foam or metal.

17. The computer system of claim 13, further comprising:

a first power supply coupled to the back face of the first substrate; and a second power supply coupled to the back face of the second substrate.

18. The computer system of claim 13, wherein the first and second substrates include metal layers that supply power to the first and second semiconductor dies.

19. The computer system of claim 18, wherein the first and second substrates include power connectors on the back faces of the first and second substrates.

20. The computer system of claim 18, wherein the integrated circuit assembly module further comprises Micro Electro-Mechanical System (MEMS) spring contacts that provide power from the metal layers within the first and second substrates to the first and second semiconductor dies, wherein:

a first set of MEMS spring contacts on the front face of the first substrate contact the active side of the second semiconductor die; and a second set of MEMS spring contacts on the front face of the second substrate contact the active side of the first semiconductor die.

21. The computer system of claim 18, wherein the integrated circuit assembly module further comprises:

a first power regulator incorporated within the first substrate; and a second power regulator incorporated within the second substrate.

22. The computer system of claim 13, wherein the integrated circuit assembly module further comprises:

an I/O semiconductor die with an active face upon which active circuitry and signal pads reside, and a back face opposite the active face;

wherein the I/O semiconductor die and the second semiconductor die are arranged active face to active face, so that signal pads on the I/O semiconductor die overlap with signal pads on the second semiconductor die, thereby facilitating capacitive communication between the I/O semiconductor die and the second semiconductor die;

wherein the I/O semiconductor die is located on an edge of the first substrate to facilitate in providing communications into and out of the integrated circuit assembly module; and wherein the edge of the first substrate extends beyond the edge of the second substrate so that a portion of the active face of the I/O semiconductor die is exposed to facilitate external connections.

23. The computer system of claim 22, wherein the integrated circuit assembly module further comprises optical external connection pads located on the exposed portion of the active side of the I/O semiconductor die.

24. The computer system of claim 22, wherein the integrated circuit assembly module further comprises electrical external connection pads located on the exposed portion of the active side of the I/O semiconductor die.

* * * * *